United States Patent [19]

Johnson et al.

[11] 4,074,031

[45] Feb. 14, 1978

[54] PROCESS FOR PREPARING ELECTRON BEAM RESISTS

[75] Inventors: Duane Edward Johnson, Los Gatos; Lester Arlyn Pederson, San Jose, both of Calif.

[73] Assignee: International Business Machines Corporation, Armonk, N.Y.

[21] Appl. No.: 721,259

[22] Filed: Sept. 8, 1976

[51] Int. Cl.² .............................................. C08F 8/32
[52] U.S. Cl. .................................................... 526/49
[58] Field of Search ......................................... 526/49

[56] References Cited

U.S. PATENT DOCUMENTS

| 3,328,367 | 6/1967 | Rees ........................................ 526/49 |
| 3,728,319 | 4/1973 | Kiesel et al. ............................ 526/49 |

*Primary Examiner*—William F. Hamrock
*Attorney, Agent, or Firm*—Joseph G. Walsh

[57] ABSTRACT

Positive electron beam resists are prepared by reacting a film which is a copolymer of methyl methacrylate and methacrylic acid with a tertiary amine.

5 Claims, No Drawings

PROCESS FOR PREPARING ELECTRON BEAM RESISTS

FIELD OF THE INVENTION

The present invention is concerned with a process of the preparation of a positive electron beam resist. A film comprising a copolymer of methyl methacrylate and methacrylic acid is treated with a tertiary amine, for example, triethyl amine. The treatment with the amine causes the conversion of some acid groups in the copolymer into anhydride groups. This change is brought about at a temperature lower than previously possible, and as a result, competing degrading reactions are avoided.

PRIOR ART

The prior art is aware of the use of positive electron beam resist films which are copolymers containing methacrylic anhydride units. (See German O.G. No. 2,363,092 of Roberts). That reference, however, contains no mention whatsoever of the use of tertiary amines in the preparation of the films.

Copolymers have been treated with amines in the past. See, for example, U.S. Pat. No. 3,328,367 of Rees. That patent is concerned with cross linking copolymers by treating them with diamines. The amines used, however, were all primary or secondary amines, in contrast to the present invention where tertiary amines are required to bring about anhydride formation.

SUMMARY OF THE INVENTION

Positive acting polymeric electron beam resists are well known in the prior art. Such prior art is thoroughly discussed in, for example, U.S. Pat. No. 3,535,137 of Haller et al. That patent provides a very good discussion of typical methods for fabricating and using resist materials. As is explained in that patent, the process typically starts by dissolving a suitable polymer in a solvent. A thin polymer film is then formed on a substrate by a process such as, for example, spinning a drop of the dissolved polymer on the substrate surface and allowing it to dry. The polymer film is the pre-baked to improve the adhesion and handling characteristics of the film. The next step involves image-wise exposing of selected portions of the polymer film to electron beam radiation, in the range of 5 to 30 kilovolts. This radiation causes scission of the bonds of the polymer. As a result of such scissions, the portions of the polymer film which have been exposed to the radiation may be selectively removed by application of a developer solvent while leaving the unexposed portion of the film still adhered to the substrate. When it is so desired, the remaining polymer film may be baked to eliminate undercutting. Following this, in cases where it is so desired, the exposed underlying substrate may be etched with a suitable etchant.

There are relatively few materials which simultaneously possess all of the required properties to act as resists. It is necessary that the material be chemically resistant to etching solutions but still degrade under radiation. The material must be capable of adhering to the substrate as a film, and the film must resist cracking.

Copolymers of methyl methacrylate and methacrylic acid have been found to be very suitable for use as electron beam resist materials. When using these materials in the past, it has been necessary to pre-bake the films in order to obtain polymeric structures suitable for pattern formation on wafers. Generally, this pre-baking has taken place at temperatures of about 200° to 240° C. for about 1 hour. At these temperatures, structural changes occurred, such as the conversion of acid groups to anhydride. Also, at these temperatures, competing reactions can take place, such as the decomposition of polymer chains. It is desirable to promote the formation of anhydride groups which lead to polymer network formation, and to minimize decomposition which degrade the network.

It has now been discovered that by the addition of a tertiary amine to the copolymer prior to baking, one can promote the formation of anhydride groups by a factor of about 2 to about 5 times. Thus, by the use of tertiary amines in accordance with the present invention, positive electron beam resists can be made by a process which avoids the high temperature previously required.

In using the process of the present invention, it is essential that the amine be a tertiary amine. The use of primary or secondary amines leads to the formation of undesirable amide and/or imide groups. The most preferred tertiary amines are triethyl amine and trimethyl amine, but others may also be used.

The following examples are given solely for purposes of illustration and are not to be considered limitations on the invention, many variations of which are possible without departing from the spirit or scope thereof.

EXAMPLES

Resist films were prepared by dissolving copolymers of methyl methacrylate and methacrylic acid in a solvent, namely, methyl cellosolve. These solutions were mixed with approximately one equivalent (based on the acid content) of triethyl amine. The solutions were then cast on sodium chloride plates, which were mounted on a constant temperature aluminum block, which had narrow slits cut into it so that structural changes in the film could be followed by infrared spectroscopy.

The starting copolymers contained methyl methacrylate and methacrylic acid in the ratios of 75 to 25, 65 to 35, and 50 to 50. In all cases, it was found that when the tertiary amine had been added anhydride formation occurred at 184° C. at the same rate as at 201° C. when no tertiary amine had been added. Thus, the pre-baking temperature was decreased by 17° C.

Using the same copolymers as films on sodium chloride, experiments were carried out at 184° C. both with and without tertiary amine additive. In all cases, the addition of the tertiary amine dramatically increased the rate of anhydride formation. With the amine present, the pre-baking can be completed in about 30 minutes, instead of an hour as previously required.

What is claimed is:

1. A process for preparing a positive electron beam resist comprising reacting a film which is a copolymer of from 75% to 50% methyl methacrylate and from 25% to 50% methacrylic acid with a tertiary amine.

2. A process as claimed in claim 1 wherein the reaction leads to the formation of anhydride groups.

3. A process as claimed in claim 1 wherein the tertiary amine is triethyl amine.

4. A process as claimed in claim 1 wherein the reaction is carried out at about 184° C.

5. A process is claimed in claim 1 wherein the reaction is carried out for about 30 minutes.